(12) United States Patent
Vattikonda et al.

(10) Patent No.: US 8,891,273 B2
(45) Date of Patent: Nov. 18, 2014

(54) PSEUDO-NOR CELL FOR TERNARY CONTENT ADDRESSABLE MEMORY

(71) Applicant: QUALCOMM Incorporated, San Diego, CA (US)

(72) Inventors: Rakesh Vattikonda, San Diego, CA (US); Nishith Desai, San Diego, CA (US); Changho Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 43 days.

(21) Appl. No.: 13/727,494

(22) Filed: Dec. 26, 2012

(65) Prior Publication Data

US 2014/0177310 A1    Jun. 26, 2014

(51) Int. Cl.
*G11C 15/00* (2006.01)
*G11C 15/04* (2006.01)

(52) U.S. Cl.
CPC ............... *G11C 15/00* (2013.01); *G11C 15/04* (2013.01)
USPC ..................... 365/49.17; 365/49.16; 365/49.1

(58) Field of Classification Search
USPC ...................... 365/49.17, 49.16, 49.1, 189.11
See application file for complete search history.

(56) References Cited

U.S. PATENT DOCUMENTS

| | | | |
|---|---|---|---|
| 6,044,005 A | 3/2000 | Gibson et al. | |
| 6,385,070 B1 | 5/2002 | Peterson | |
| 6,400,593 B1 | 6/2002 | Lien et al. | |
| 6,411,538 B1 | 6/2002 | Kengeri | |
| 6,574,702 B2 | 6/2003 | Khanna et al. | |
| 6,760,242 B1 | 7/2004 | Park et al. | |
| 6,775,168 B1 | 8/2004 | Park et al. | |
| 7,050,318 B1 | 5/2006 | Argyres | |
| 7,110,275 B2 | 9/2006 | Park | |
| 7,154,764 B2 | 12/2006 | Nataraj | |
| 7,286,379 B1 | 10/2007 | Sun | |
| 7,355,890 B1 | 4/2008 | Wen | |
| 7,555,594 B2 | 6/2009 | Venkatachary | |
| 7,940,541 B2 | 5/2011 | Ali et al. | |
| 8,125,810 B2 | 2/2012 | Bosshart | |

(Continued)

FOREIGN PATENT DOCUMENTS

WO    WO-03056565 A1    7/2003

OTHER PUBLICATIONS

Chang, et al., "A low-power TCAM design using mask-aware match-line (MAML) technique", GLSVLSI '11: Proceedings of the 21st edition of the great lakes symposium on Great lakes symposium on VLSI, May 2011, 6 pgs.

(Continued)

*Primary Examiner* — David Lam
(74) *Attorney, Agent, or Firm* — Paul S. Holdaway (57) ABSTRACT

A method within a ternary content addressable memory (TCAM) includes receiving a match line output from a previous TCAM stage at a gate of a pull-up transistor of a current TCAM stage and at a gate of a pull-down transistor of the current TCAM stage. The method sets a match line bar at the current TCAM stage to a low value, via the pull-down transistor, when the match line output from the previous TCAM stage indicates a mismatch. The method also sets the match line bar at the current TCAM stage to a high value, via the pull-up transistor, when the match line output from the previous TCAM stage indicates a match.

15 Claims, 8 Drawing Sheets

(56) References Cited

U.S. PATENT DOCUMENTS

| | | | |
|---|---|---|---|
| 8,169,808 B2 | 5/2012 | Roohparvar | |
| 8,582,338 B1 * | 11/2013 | Argyres | 365/49.17 |
| 2005/0276086 A1 | 12/2005 | Perry et al. | |
| 2009/0141580 A1 | 6/2009 | Evans et al. | |
| 2009/0310395 A1 | 12/2009 | Chiang | |
| 2012/0063189 A1 | 3/2012 | Maurya et al. | |
| 2014/0185348 A1 | 7/2014 | Vattikonda et al. | |
| 2014/0185349 A1 | 7/2014 | Terzioglu et al. | |

OTHER PUBLICATIONS

Huang, et al., "Energy-Efficient Design for Ternary Content Addressable Memory", International Journal of Electrical Engineering, v 15, n 2, ISSN:18123031, Apr. 2008, p. 97-108.

Matsunaga, et al., "Design of a Low-Energy Nonvolatile Fully-Parallel Ternary CAM Using a Two-Level Segmented Match-Line Scheme", 41st IEEE International Symposium on Multiple-Valued Logic, 2011, pp. 99-104.

Pagiamtzis K., et al., "Content-Addressable Memory (CAM) Circuits and Architectures: A Tutorial and Survey," IEEE Journal of Solid-State Circuits, vol. 41, No. 3 Mar. 2006, pp. 712-727.

International Search Report and Written Opinion—PCT/US2013/076835—ISAEPO—Apr. 4, 2014.

Wang J.S., et al., "Design trend of energy-efficient CAMs," SoC Design Conference, 2008, ISOCC '08, International, IEEE, Piscataway, NJ, USA, Nov. 24, 2008, pp. I-21-I-24, XP031449435, ISBN: 978-1-4244-2598-3.

* cited by examiner

PSEUDO-NOR CELL FOR TERNARY CONTENT ADDRESSABLE MEMORY

TECHNICAL FIELD

The present disclosure relates generally to a ternary content addressable memory (TCAM). More specifically, the disclosure relates to a pseudo-NOR architecture for a TCAM.

BACKGROUND

TCAMs are typically used in routers and Ethernet switches for Internet protocol (IP) address forwarding. The storage elements are typically designed using a dynamic NOR/NAND type cell.

Content addressable memory (CAM) supports a read operation, write operation, and compare operation. A compare bus of the same width (e.g., bits per word) as an entry in the CAM is input at a clock edge. The data of the compare bus is simultaneously compared to every entry in the CAM. That is, the comparison occurs parallel so the bus may be compared to every entry in the CAM during one clock cycle. An entry is a match when every bit in an entry matches the corresponding bit in the compare bus. Alternatively, an entry is a mismatch when any bit in an entry does not match the corresponding bit in the compare bus. The bits of the entries in the CAM are either 0 or 1.

A TCAM is similar to CAM with the addition of a mask value that may be stored in a cell. The mask value may be referred to as a local mask. A mask value is not compared with a compare bit, and therefore, the compare result will always be a match.

Figure 1:
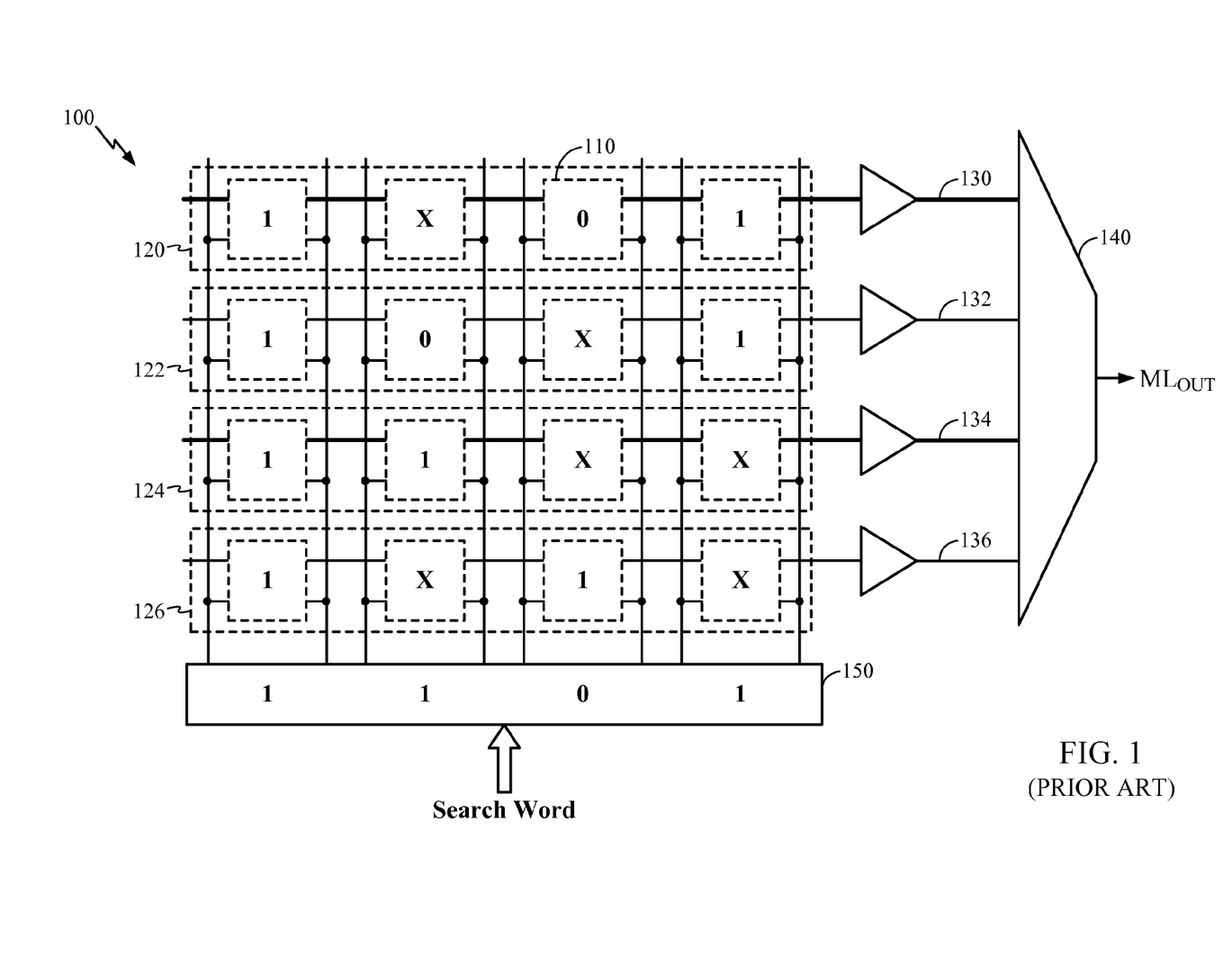
FIG. 1 illustrates a TCAM memory system.

FIG. 1 illustrates an architecture of a conventional TCAM 100. As illustrated in FIG. 1, a search word, such as "1101," is input to a register 150 of the TCAM 100. The search word is compared to the value stored in the TCAM cells 110. TCAMs typically have sixteen TCAM cells per stage. The search is simultaneously conducted across the TCAM cells 110. The content of the TCAM cells 110 may be a high bit (1), a low bit (0), or a mask value (X). Prior to the search, a match line 130-136 for each set of TCAM cells 120-126 is set to high. The match lines 130-136 are input to a priority encoder 140. The TCAM 100 outputs (MLout) the address of the set of TCAM cells that match the search word line. Because the search is a parallel search, the search may be completed in one clock cycle. It should be noted that a mask value may be a 0 or 1, still, in the present disclosure, the mask value may be referred to as an X.

As an example, as illustrated in FIG. 1, a first set of TCAM cells 120 is set to "1 X 0 1," a second set of TCAM cells 122 is set to "1 0 X 1," a third set of TCAM cells 124 is set to "1 1 X X," and a fourth set of TCAM cells 126 is set to "1 X 1 X." When comparing the content of the TCAM cells to the search bit, when the content of the TCAM cell is a mask value X, the comparison will yield a match. Thus, according to the example illustrated in FIG. 1, the first set of TCAM cells 120 and the third set of TCAM cells 124 match the search word in the register 150. Accordingly, the match lines 130 134 of the first set of TCAM cells 120 and the third set of TCAM cells 124 will indicate a match and the priority encoder 140 outputs the address of the first set of TCAM cells 120 and the third set of TCAM cells 124.

The conventional TCAM architecture is a dynamic circuit and has a high dynamic power dissipation. In some cases, the TCAM may have a dynamic NAND architecture. In other cases, the TCAM may have a dynamic NOR architecture.

Figure 2:
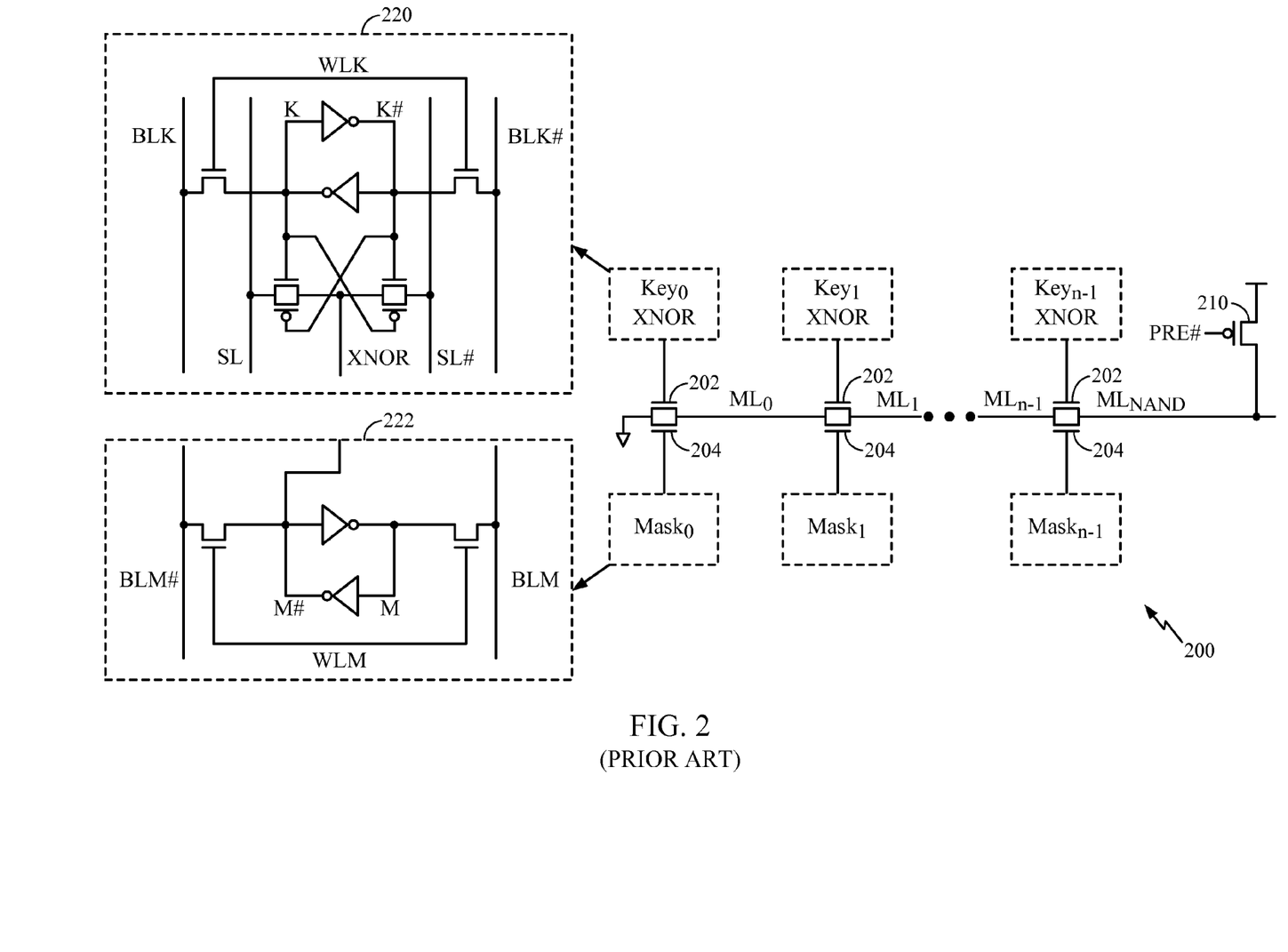
FIG. 2 illustrates a prior art dynamic NAND architecture.

FIG. 2 illustrates a conventional dynamic NAND TCAM 200. As illustrated in FIG. 2, the dynamic NAND architecture 200 includes a match line $ML_{NAND}$ charged by a pre-charge line PRE# from a pull-up transistor 210. The match line $ML_{NAND}$ is connected to a series of intermediate match lines $ML_0$-$ML_{n-1}$. Each of the intermediate match lines $ML_0$-$ML_{n-1}$ is coupled to a mask cell $Mask_0$-$Mask_{n-1}$ and a key cell $Key_0$-$Key_{n-1}$ via a transmission gate. The transmission gate includes a key NMOS transistor 202 coupled to a key cell $Key_0$-$Key_{n-1}$ and a mask NMOS transistor 204 coupled to a mask cell $Mask_0$-$Mask_{n-1}$.

The content of the mask cells $Mask_0$-$Mask_{n-1}$ is illustrated in an expanded mask cell 222. As shown in the expanded mask cell 222, mask cells $Mask_0$-$Mask_{n-1}$ are SRAM cells including a mask value M, a mask value bar M#, a mask word line WLM, a mask bit line BLM, and a mask bit line bar BLM#. The content of the key cells $Key_0$-$Key_{n-1}$ is illustrated in an expanded key cell 220. As shown in the expanded key cell 220, the key cells $Key_0$-$Key_{n-1}$ are SRAM cells with XNOR logic. The key cells $Key_0$-$Key_{n-1}$ further include a search line SL, a search line bar SL#, a key bit line BLK, a key bit line bar BLK#, a key value K, a key bar value K#, and a key write line WLK.

In a dynamic NAND TCAM architecture, the match lines are pre-charged high and evaluate low to indicate a match. That is, a pre-charge signal is used for each match line during every cycle to set the match lines to high. Depending on the status of the mask cell or key cell, the match line may be pulled low or remain high. Each intermediate match line is associated with a mask cell and a key cell. Furthermore, each key cell further includes XNOR logic. The dynamic NAND TCAM uses a serial operation. Thus, an intermediate match line (n−1) may discharge (e.g., compare with the value of the search line) when the previous intermediate match line (n−2) was pulled low to indicate a match. That is, the operation continues from one intermediate match line (n−2) to a subsequent intermediate match line (n−1) when there is a match and stops progressing through the intermediate match lines when there is a mismatch.

In a dynamic NOR TCAM architecture, match lines are pre-charged high and evaluate low to indicate a mismatch. The majority of comparisons yield a mismatch, and therefore, the dynamic NOR has an increased power consumption as a result of switching from high to low for indicating a mismatch. Furthermore, the dynamic NOR has a complex timing control because the pre-charge signal is used by each match line in each clock cycle.

Figure 3:
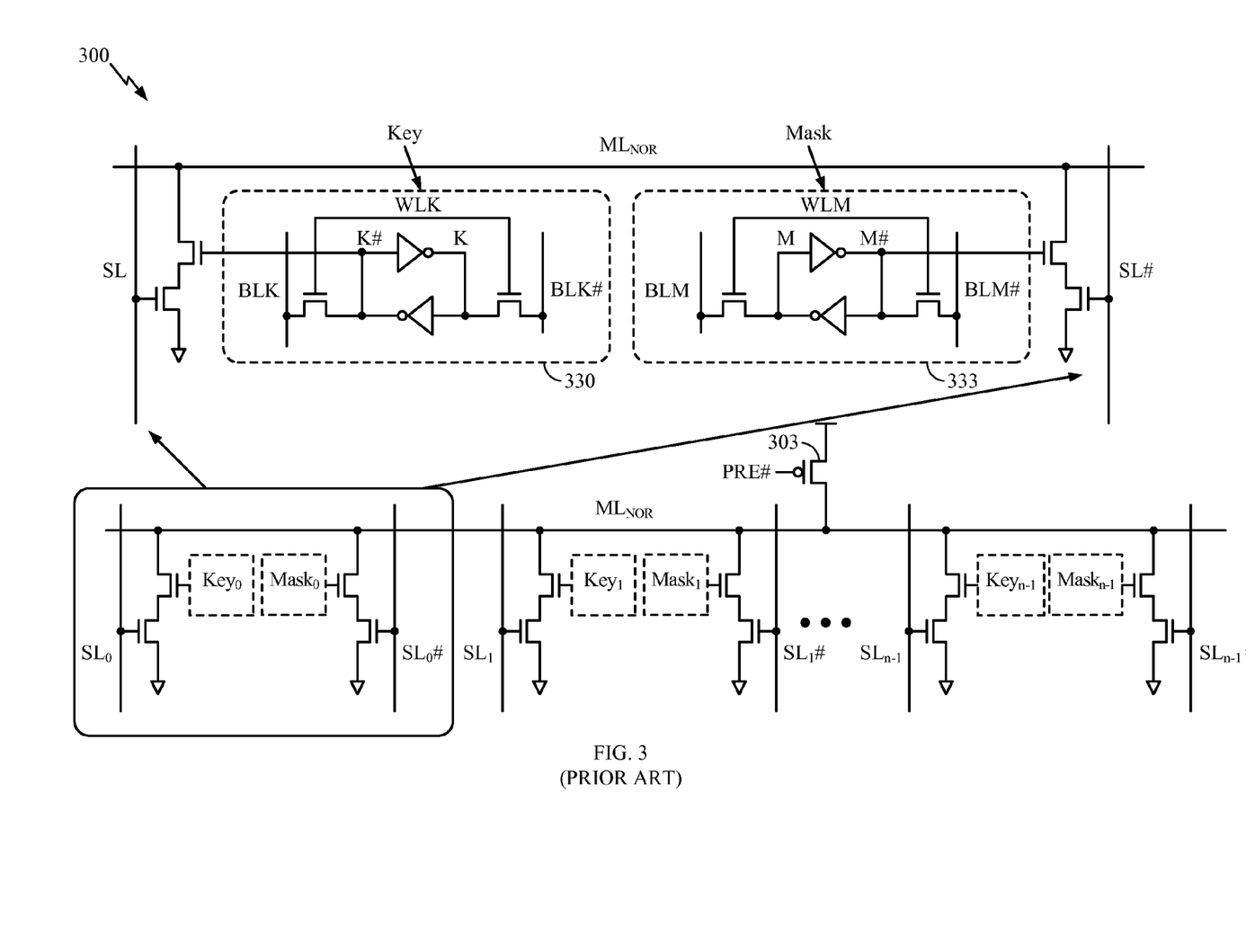
FIG. 3 illustrates a prior art dynamic NOR architecture.

FIG. 3 illustrates a conventional dynamic NOR TCAM 300. As illustrated in FIG. 3, the dynamic NOR TCAM 300 includes key cells $Key_0$-$Key_{n-1}$ and mask cells $Mask_0$-$Mask_{n-1}$. Typically, a NOR TCAM, such as the NOR TCAM 300 of FIG. 3, may have sixteen key and mask cells. Data is input via search lines ($SL_0$-$SL_{n-1}$ and $SL_0\#$-$SL_{n-1}\#$). The data is compared to the values stored in the key cells $Key_0$-$Key_{n-1}$ and mask cells $Mask_0$-$Mask_{n-1}$. The match line $ML_{NOR}$ and search lines ($SL_0$-$SL_{n-1}$ and $SL_0\#$-$SL_{n-1}\#$) are pre-charged high via the pre-charge line PRE# from a pull-up transistor 303. The match line $ML_{NOR}$ will evaluate low when there is a mismatch between the data input via one of the search lines ($SL_0$-$SL_{n-1}$ and $SL_0\#$-$SL_{n-1}\#$) and the data stored in one of the cells $Key_0$-$Key_{n-1}$ $Mask_0$-$Mask_{n-1}$. The match line remains high when the values of all of the cells $Key_0$-$Key_{n-1}$ $Mask_0$-$Mask_{n-1}$ match the input data.

The structure of the key cells $Key_0$-$Key_{n-1}$ is illustrated in the expanded key cell 330 and the structure of the mask cells $Mask_0$-$Mask_{n-1}$ is illustrated in the expanded mask cell 333. As illustrated in the expanded key cell 330, the key cells $Key_0$-$Key_{n-1}$ are implemented via an SRAM cell. During a compare operation, the key bar K# is ANDed with the search line SL. The key cells $Key_0$-$Key_{n-1}$ include a bit line BLK, a bit line bar BLK#, and a word line WLK.

As illustrated in the expanded mask cell 333, the mask cells $Mask_0$-$Mask_{n-1}$ are implemented via a SRAM cell. During a comparison operation, the mask bar M# is ANDed with the search line bar SL#. The mask cells $Mask_0$-$Mask_{n-1}$ include a bit line BLM, a bit line bar BLM#, and a word line WLM.

TABLE 1 is a truth table for the dynamic NOR TCAM. TABLE 1 shows the value of the match line based on the values of the mask cells (M), key cells (K), and the search lines (SL and SL#). It should be noted that the state refers to the state of a storage element (key cell and mask cell). The state is 0 when the key bit has a value of 0, the state is 1 when the key bit has a value of 1, and the state is X when both the mask bit and the key bit are 1. The state of X refers to a mask state in which there is neither a match nor a mismatch, rather, there is no comparison between the value of the search line and the values of the mask cell and key cell. Thus, the match line always indicates a match.

TABLE 1

| State | Mask Bit (M) | Key Bit (K) | Search Line (SL) | Search Line Bar (SL#) | Match Line ($ML_{NOR}$) |
|---|---|---|---|---|---|
| 0 | 1 | 0 | 0 | 1 | 1 |
| 0 | 1 | 0 | 1 | 0 | 0 |
| 1 | 0 | 1 | 0 | 1 | 0 |
| 1 | 0 | 1 | 1 | 0 | 1 |
| X | 1 | 1 | X | X | 1 |
| — | 0 | 0 | — | — | Not Allowed |

As shown in TABLE 1, the match line will be 0 (low) and indicate a mismatch when the key bit and search line have different values. Likewise, the match line will be 0 and indicate a mismatch when both the mask bit and search line bar have different values. That is, when the key bit is 0 (e.g., key bit bar (K#) is 1) and the search line is 1 or when the mask bit is 0 (e.g., mask bit bar (M#) is 1) and the search line bar is 1, a pull down transistor will be activated to pull the match line to low. Moreover, the match line will be 1 (high) and indicate a match when the key bit and search line have the same values. Likewise, the match line will be 1 and indicate a match when both the mask bit and search line bar have the same values. Furthermore, when both the mask bit and key bit are 1, the state is X. That is, the match line will remain high and indicate a match regardless of the value of the search line.

As discussed above, in a dynamic NOR TCAM, the match lines and search lines are pre-charged high at the beginning of every cycle and the match lines evaluate low to indicate a mismatch. The majority of comparisons of the cells in a TCAM yield a mismatch. Thus, the power consumption of the dynamic NOR TCAM is increased as a result of the switching from high to low when indicating a mismatch. In some cases, match lines may be pre-discharged low to reduce the power consumption. Still, even when then match lines are pre-discharged, a pre-charge operation charges the match line at the beginning of every cycle. Accordingly, the pre-charging of the match line leads to an increase in power consumption and additionally control circuitry.

SUMMARY

According to an aspect of the present disclosure, a method within a ternary content addressable memory (TCAM) includes receiving a match line output from a previous TCAM stage at a gate of a pull-up transistor of a current TCAM stage. The method also includes receiving the match line output from the previous TCAM stage at a gate of a pull-down transistor of the current TCAM stage. The method further includes setting a match line bar at the current TCAM stage to a low value, via the pull-down transistor, when the match line output from the previous TCAM stage indicates a mismatch. The method still further includes setting the match line bar at the current TCAM stage to a high value, via the pull-up transistor, when the match line output from the previous TCAM stage indicates a match.

According to another aspect, a TCAM is presented. The TCAM includes a pull-up means for receiving a match line output from a previous TCAM stage at a current TCAM stage. The TCAM also includes a pull-down means for receiving the match line output from the previous TCAM stage at the current TCAM stage. The TCAM further includes means for setting a match line at the current TCAM stage to a low value, via the first means, when the match line output from the previous TCAM stage indicates a mismatch. The TCAM still further includes means for setting the match line at the current TCAM stage to a high value, via the second means, when the match line output from the previous TCAM stage indicates a match.

According to still yet another aspect, a TCAM is presented. The TCAM includes a pull-up transistor stack configured to receive a match line output from a previous TCAM stage at a current TCAM stage. The pull-up transistor stack sets a match line bar at the current TCAM stage to a low value when the match line output from the previous TCAM stage indicates a mismatch. The TCAM further includes a pull-down transistor configured to receive the match line output from the previous TCAM stage at the current TCAM stage. The pull-down transistor sets the match line bar at the current TCAM stage to a high value when the match line output from the previous TCAM stage indicates a match;

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

It is desired to provide a TCAM that does not pre-charge the match line and has a reduced complexity for the timing control circuitry. Aspects of the present disclosure provide a pseudo-NOR TCAM that does not pre-charge the match line and reduces the complexity of the timing control circuitry. The pseudo-NOR TCAM may be referred to as a pseudo-NOR.

According to the present disclosure, the pseudo-NOR does not use a complex timing control circuitry for a match line pre-charge because the match line (ML) is not pre-charged before each cycle. In the present aspect, the pseudo-NOR uses a pseudo-NOR gate to eliminate the pre-charge circuitry and reduce the complexity of the timing control circuitry.

Figure 4:
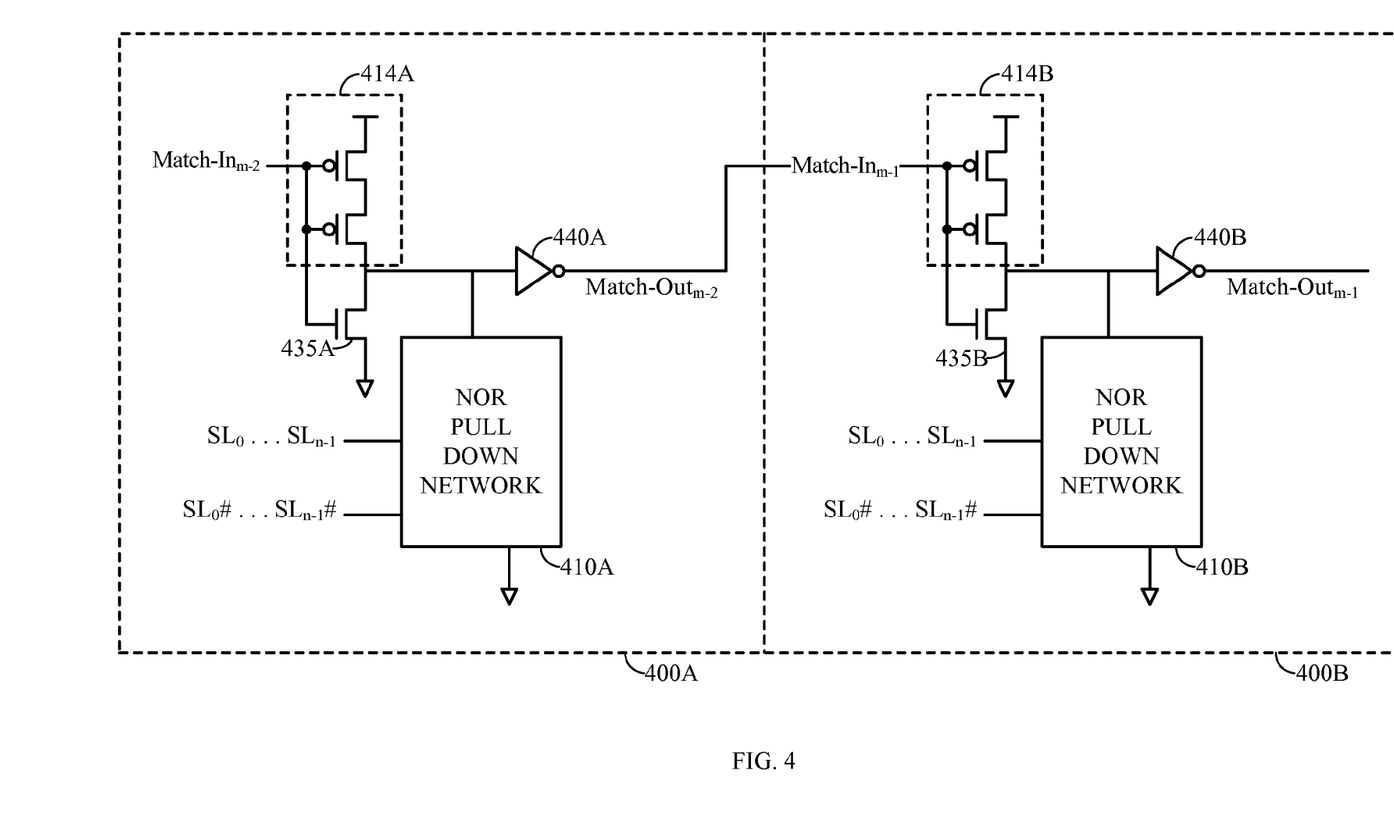
FIGS. 4 and 5 illustrate pseudo-NOR architectures according to aspects of the present disclosure.

FIG. 4 illustrates an architecture of a pseudo-NOR 400A and 400B according to an aspect of the present disclosure. As illustrated in FIG. 4, the pseudo-NOR 400A includes a NOR pull down network 410A that receives inputs from a set of search lines $SL_0 \ldots SL_{n-1}$ and a complementary set of search lines $SL_0\# \ldots SL_{n-1}\#$. Although FIG. 4 illustrates just two pseudo-NOR stages (400A and 400B), in implementation, a TCAM row (which stores a TCAM entry) may have m pseudo-NOR stages, each of the m pseudo-NOR stages having n cells. Consequently, each TCAM entry (stored in a TCAM row) may comprise n×m values stored by n×m cells. Each cell includes a mask cell and a key cell as described further below. Although the search line and search line bar inputs to pseudo-NOR stages 400A and 400B are both labeled the same way, each of the search line and search line bar inputs is unique.

Furthermore, the pseudo-NOR 400A may also include a match line output Match-out$_{m-2}$ and an inverter 440A coupled to the match line output Match-out$_{m-2}$. Moreover, the NOR pull down network 410A is further coupled to a PMOS stack 414A. The PMOS stack 414A includes two PMOS transistors and receives an input from the match line input Match-in$_{m-2}$. A pseudo-NOR may comprise the PMOS stack 414A and a pull-down transistor 435A. It should be noted that the PMOS stack 414A is not limited to two PMOS transistors. Aspects of the present disclosure contemplate a stack with only a single weak PMOS transistor, or a stack with more than two weak PMOS transistors.

It should be noted that the match line input (Match-in) is the match line output (Match-out) of a previous NOR pull down network (e.g., pseudo-NOR). That is, the match line input to a pseudo-NOR (pseudo-NOR 400B) is coupled to the match line output of a previous NOR (pseudo-NOR 400A). For example, as illustrated in FIG. 4, the match line output Match-out$_{m-2}$ of a pseudo-NOR 400A is the match line input Match-in$_{m-1}$ of a subsequent pseudo-NOR 400B. The architecture of the pseudo-NORs 400A and 400B of FIG. 4 is similar. Specifically, the pseudo-NOR 400B also includes a NOR pull down network 410B, pull-down transistor 435B, a PMOS stack 414B, and an inverter 440B. In the present disclosure, each pseudo-NOR (e.g., 400A and 400B) may be referred to as a TCAM stage.

In one configuration, the TCAM stages (e.g., pseudo-NOR 400A and pseudo-NOR 400B) may be connected serially to form a row of m TCAM stages (0 . . . m−1). Each TCAM stage comprises n (0 . . . n−1) search lines, key cells, and mask cells. The search line inputs for each pseudo-NOR (e.g., 400A and 400B) of FIG. 4 are exemplary inputs for the multiple search lines of a TCAM. It should be noted that in some aspects, the number of search lines, key cells, and mask cells may vary between each TCAM stage. That is, the n value for the (0 . . . n−1) search lines, key cells, and mask cells of one TCAM stage, such as pseudo-NOR 400A, may not be the same as the n value for the (0 . . . n−1) search lines, key cells, and mask cells of another TCAM stage, such as pseudo-NOR 400B.

Power is saved by serially connecting the pseudo-NORs. Specifically, connecting the gates of the pull-up transistors (e.g., PMOS stack) to a match line output of a previous pseudo-NOR saves power because the previous match line output acts as a control signal to turn off the pull-up transistors when a comparison is not specified (e.g., when the previous match line output/match line input indicates that the previous comparison was a mismatch). More specifically, the serial connection to the PMOS stack of the NOR pull down networks is a component of a pseudo-NOR that replaces the pre-charge and/or the pre-discharge of a conventional dynamic NOR.

The pseudo-NOR provides higher speeds and a lower transistor count in comparison to a conventional NOR architecture of a TCAM. Still, the pseudo-NOR has a static power consumption because of the pull-up transistor (PMOS stack) and has a reduced output voltage swing. Nonetheless, the overall speed improvement of the pseudo-NOR is still desirable in view of the increase of static-power consumption. It should be noted that the pull-up transistor(s) of the pseudo-NOR should be wide enough to conduct leakage of a NMOS-block and narrow enough for the NMOS-block to safely pull down the output.

Figure 5:
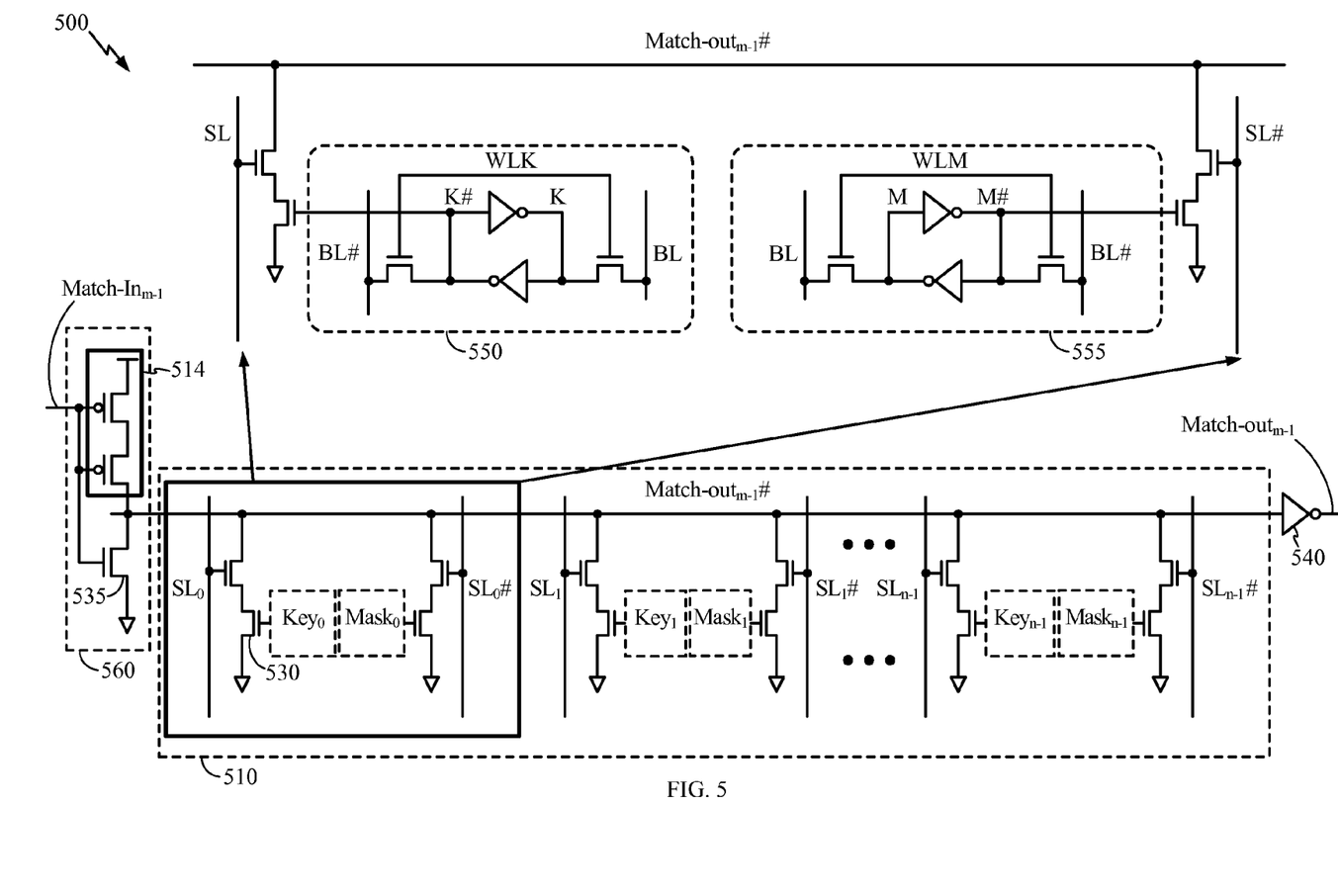

FIG. 5 illustrates an exemplary pseudo-NOR TCAM stage 500 according to aspects of the present disclosure. The pseudo-NOR TCAM stage 500 is an expanded view of a pseudo-NOR TCAM stage, such as pseudo-NOR TCAM stages 400A and 400B of FIG. 4.

As illustrated in FIG. 5, the pseudo-NOR TCAM stage 500 includes an inverter 540 coupled to a match line output Match-out$_{m-1}$, a PMOS stack 514 coupled to a match line input Match-in$_{m-1}$, and a pull-down transistor 535 coupled to a match line input Match-in$_{m-1}$, and a NOR pull down network 510. The NOR pull down network 510 includes key cells Key$_0$-Key$_{n-1}$ and mask cells Mask$_0$-Mask$_{n-1}$. Exemplary structures of the key cells and mask cells are illustrated in more detail in the expanded key cell 550 and expanded mask cell 555.

In operation, data is presented via search lines (SL$_0$-SL$_{n-1}$ and SL$_0\#$-SL$_{n-1}\#$). The data is compared to the values stored in the key cells Key$_0$-Key$_{n-1}$ and mask cells Mask$_0$-Mask$_{n-1}$. As illustrated in the expanded key cell 550, the key cells Key$_0$-Key$_{n-1}$ can be implemented with an SRAM cell. During a compare operation, the key bar K# is logically ANDed with the search line SL. The key cells $Key_0$-$Key_{n-1}$ include bit lines BL BL# and a key word line WLK. As illustrated in the expanded mask cell 555, the mask cells $Mask_0$-$Mask_{n-1}$ can be implemented via an SRAM cell. During a comparison operation, the mask bar M# is logically ANDed with the search line bar SL#. The mask cells $Mask_0$-$Mask_{n-1}$ include bit lines BL BL# and a mask word line WLM. That is, the mask cells $Mask_0$-$Mask_{n-1}$ and key cells $Key_0$-$Key_{n-1}$ may each share respective bit lines but may use their own word lines, i.e., different wordlines.

The pseudo-NOR TCAM stage 500 further includes an input stage 560 coupled to the match line bar Match-out$_{m-1}$#. The input stage 560 receives an input Match-in$_{m-1}$ from a match line output Match-out$_{m-2}$ of a previous pseudo-NOR stage. As previously discussed, the input stage 560 can include a pull-down transistor 535 and a PMOS stack 514. In some cases, pseudo-NOR functionality specifies the use of the input stage 560 and the NOR pull down network 510. Finally, an inverter 540 is coupled to the end of the match line bar Match-out$_{m-1}$#. The output from the inverter 540 is the match line output Match-out$_{m-1}$.

TABLE 2 is a truth table for the masking bit and key bit. It should be noted that the state in TABLE 2 refers to the state of a storage element (key cell and mask cell). The state is 0 when the key bit has a value of 0 and the mask bit has a value of 1, the state is 1 when the key bit has a value of 1 and the mask bit has a value of 0, and the state is X when both the mask bit and the key bit are 1. The state of X refers to a mask state in which there is neither a match nor a mismatch, rather, there is no comparison between the value of the search line and the values of the mask cell and key cell. Thus, the match line always indicates a match when the state is X.

TABLE 2

| State | Mask Bit (M) | Key Bit (K) |
| --- | --- | --- |
| 0 | 1 | 0 |
| 1 | 0 | 1 |
| X | 1 | 1 |
| Not Allowed | 0 | 0 |

TABLE 3 is a truth table for the pseudo-NOR and uses the state values of TABLE 2.

TABLE 3

| Match-in$_{m-1}$ | State | $SL_{n-1}$ | $SL_{n-1}$# | Match-out$_{m-1}$ |
| --- | --- | --- | --- | --- |
| 1 | 1/0/X | X | X | 1 |
| 0 | 0 | 0 | 1 | 0 |
| 0 | 0 | 1 | 0 | 1 |
| 0 | 1 | 0 | 1 | 1 |
| 0 | 1 | 1 | 0 | 0 |
| 0 | X | X | X | 0 |

As shown in TABLE 3, the match line output Match-out$_{m-1}$ will be 0 (low) to indicate a match. A match occurs when the values of the state and search line $SL_{n-1}$ are equal. Furthermore, when the state is X, the match line output Match-out$_{m-1}$ will also be low to indicate a match. Finally, the match line output Match-out$_{m-1}$ will be 1 (high) to indicate a mismatch. A mismatch occurs when the value of the state is not equal to the value of the search line $SL_{n-1}$.

The match line output Match-out$_{m-1}$ of TABLE 3 is the output of the inverter 540 of the pseudo-NOR TCAM stage 500. As shown in FIG. 5, a match line bar Match-out$_{m-1}$# precedes inverter 540. The match line bar Match-out$_{m-1}$# will evaluate low when there is a mismatch. That is, in order to disable further comparisons of the serially connected pseudo-NORs (e.g., 400A and 400B), the input stage 560 of a subsequent pseudo-NOR is specified to receive a high input that will activate the pull-down transistor 535 to pull the match line bar Match-out$_{m-1}$# of a subsequent pseudo-NOR to low. Thus, the inverter 540 will change the match line bar Match-out$_{m-1}$# from a low signal to a high signal in order to disable a subsequent pseudo-NOR.

TABLE 3 further shows the results of receiving a match line input Match-in$_{m-1}$ that is set to high. As shown in TABLE 3, when the match line input Match-in$_{m-1}$ is high, the state is 1/0/X because there will be no evaluations. Furthermore, the match line output Match-out$_{m-1}$ will also be high to disable a subsequent pseudo-NOR 400.

Alternatively, when the match line input is low, the PMOS stack 514 is activated and the match line bar Match-out$_{m-1}$# is evaluated high. If all the comparison results match, then the match line bar Match-out$_{m-1}$# will remain high and the match line output Match-out$_{m-1}$ will be low. If the comparison results in a mismatch, the match line bar Match-out$_{m-1}$# will evaluate low and the match line output Match-out$_{m-1}$ will be high to disable a subsequent pseudo-NOR.

The disabling of a pseudo-NOR reduces the overall power consumption of the TCAM because the subsequent comparisons are disabled when there is a mismatch. That is, unlike the dynamic NOR that pre-charges match lines and search lines for each NOR pull down network regardless of the comparison results of the previous comparison, the pseudo-NOR only proceeds with subsequent comparisons when the previous comparison resulted in a match. Moreover, the pseudo-NOR does not pre-charge match lines and search lines. Accordingly, aspects of the present disclosure reduce the overall power consumption of the TCAM and further reduce the complexity of the control circuitry and timing.

Figure 6:
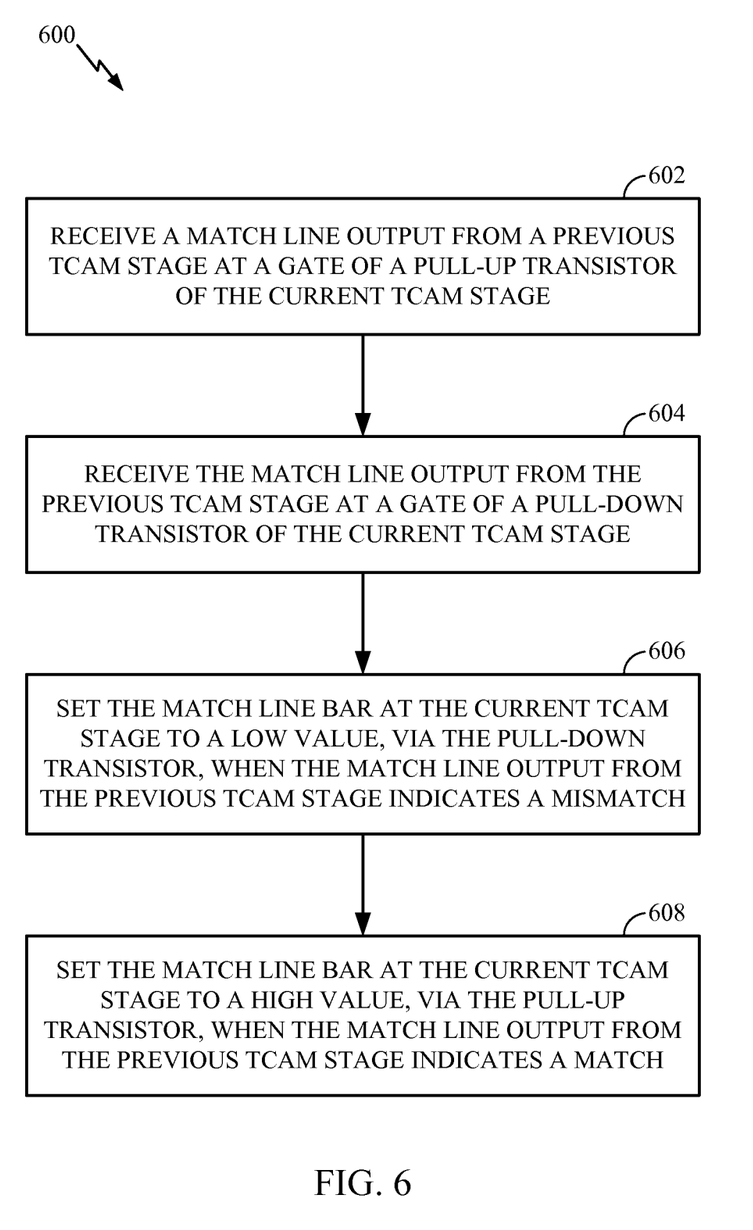
FIG. 6 is a flow chart illustrating a method for operating the pseudo-NOR architecture of FIGS. 4 and 5 according to an aspect of the present disclosure.

FIG. 6 illustrates a block diagram of a method 600 within a TCAM. As illustrated in FIG. 6, in block 602, a current TCAM stage receives a match line output from a previous TCAM stage at a gate of a pull-up transistor of the current TCAM stage. In block 604, the current TCAM stage receives the match line output from the previous TCAM stage at a gate of a pull-down transistor of the current TCAM stage. Furthermore, in block 606, a match line bar at the current TCAM stage is set to a low value, via the pull-down transistor, when the match line output from the previous TCAM stage indicates a mismatch. Finally, in block 608 the match line bar at the current TCAM stage is set to a high value, via the pull-up transistor, when the match line output from the previous TCAM stage indicates a match.

Figure 7:
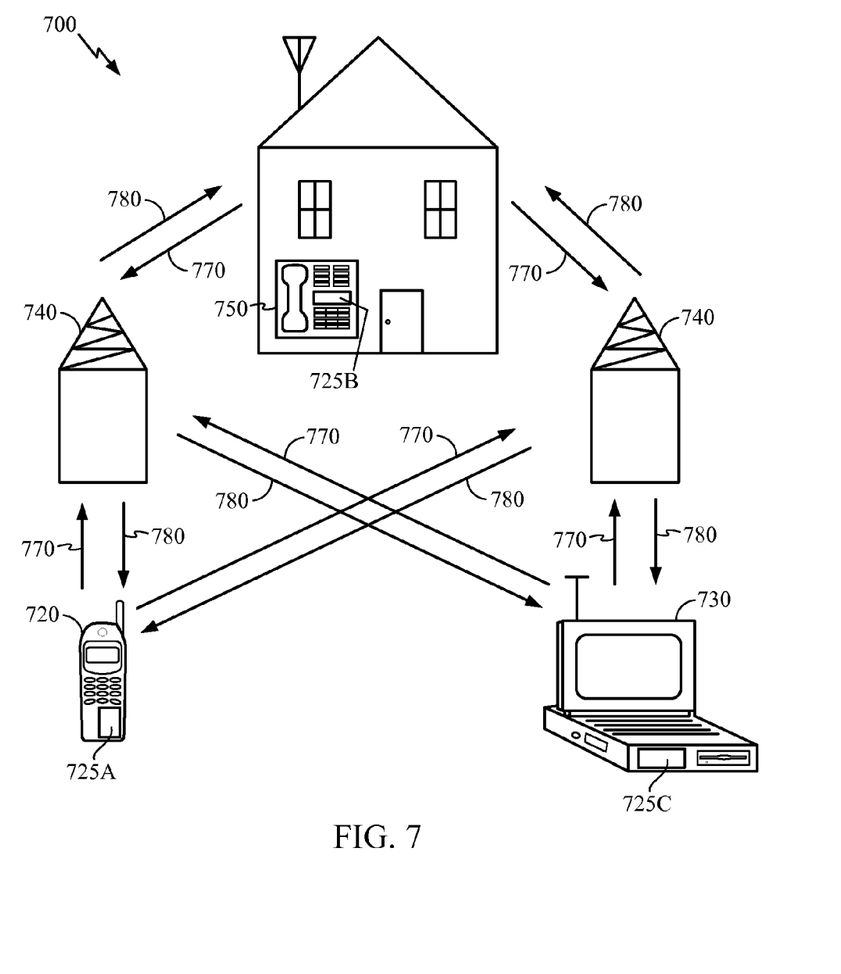
FIG. 7 illustrates an exemplary wireless communication system in which an embodiment of the disclosure may be advantageously employed.

FIG. 7 shows an exemplary wireless communication system 700 in which an embodiment of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include multi-core processors with a pseudo-NOR TCAM 725A, 725B, and 725C. FIG. 7 shows forward link signals 780 from the base stations 740 to the remote units 720, 730, and 750 and reverse link signals 770 from the remote units 720, 730, and 750 to base stations 740.

In FIG. 7, the remote unit 720 is shown as a mobile telephone, remote unit 730 is shown as a portable computer, and remote unit 750 is shown as a fixed location remote unit in a wireless local loop system. For example, the remote units may be cell phones, hand-held personal communication systems (PCS) units, a set top box, a music player, a video player, an entertainment unit, a navigation device, portable data units, such as personal data assistants, or fixed location data units such as meter reading equipment. Although FIG. 7 illustrates remote units, which may employ multi-core processors with a pseudo-NOR TCAM 725A, 725B, 725C according to the teachings of the disclosure, the disclosure is not limited to these exemplary illustrated units. For instance, multi-core processors with a pseudo-NOR TCAM according to aspects of the present disclosure may be suitably employed in any device.

Figure 8:
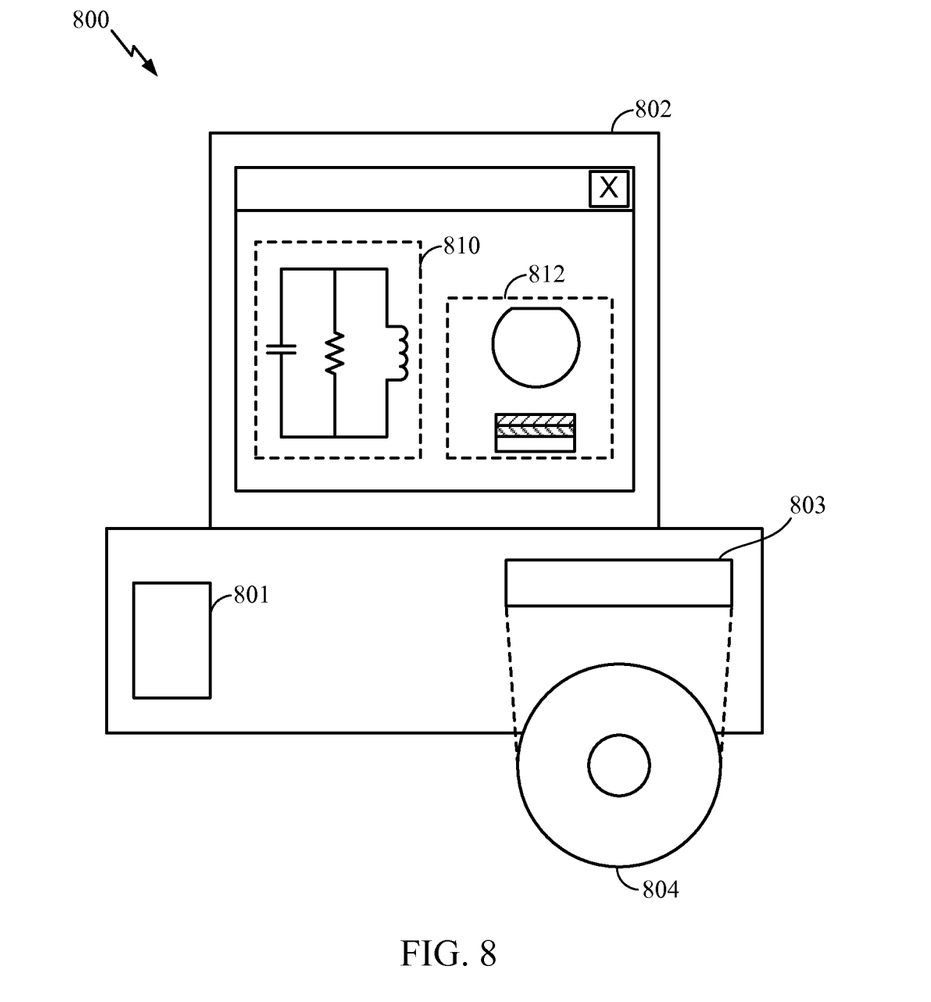
FIG. 8 is a block diagram illustrating a design workstation used for circuit, layout, and logic design of a semiconductor component according to one aspect of the present disclosure.

FIG. 8 is a block diagram illustrating a design workstation used for circuit, layout, and logic design of a semiconductor component, such as the multi-core processor with a pseudo-NOR TCAM disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as a pseudo-NOR TCAM. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

In one configuration, the TCAM includes receiving means and setting means. The receiving means may be the pseudo-NOR gate, a pull-up transistor, a pull-down transistor and/or a PMOS stack configured to perform the functions recited by the receiving means. The setting means may be the pseudo-NOR gate, a pull-up transistor, a pull-down transistor and/or a PMOS stack configured to perform the functions recited by the setting means.

In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Although specific circuitry has been set forth, it will be appreciated by those skilled in the art that not all of the disclosed circuitry is required to practice the disclosed embodiments. Moreover, certain well known circuits have not been described, to maintain focus on the disclosure.

The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. A method within a ternary content addressable memory (TCAM), the method comprising:
   receiving a first match line output from a previous TCAM stage at a gate of a pull-up transistor of a current TCAM stage;
   receiving the first match line output at a gate of a pull-down transistor of the current TCAM stage;

setting a match line bar at the current TCAM stage to a low value, via the pull-down transistor, when the first match line output indicates a mismatch; and setting the match line bar at the current TCAM stage to a high value, via the pull-up transistor, when the first match line output indicates a match.

2. The method of claim 1, further comprising:

comparing a search value to data of a cell of the current TCAM stage when the first match line output indicates the match.

3. The method of claim 2, further comprising outputting results of the comparing to a subsequent TCAM stage via a second match line output of the current TCAM stage.

4. The method of claim 2, in which the cell is a static random access memory (SRAM) cell.

5. The method of claim 1, in which each TCAM stage includes at least the pull-up transistor, the pull-down transistor, a search line, a mask cell, the match line bar, a second match line output, and a key cell.

6. A ternary content addressable memory (TCAM), comprising:

a pull-up means for receiving a match line output from a previous TCAM stage at a current TCAM stage;

a pull-down means for receiving the match line output from the previous TCAM stage at the current TCAM stage;

means for setting a match line bar at the current TCAM stage to a low value, via the pull-down means, when the match line output from the previous TCAM stage indicates a mismatch; and means for setting the match line bar at the current TCAM stage to a high value, via the pull-up means, when the match line output from the previous TCAM stage indicates a match.

7. The TCAM of claim 6, further comprising:

means for comparing a search value to data of a cell when the match line output from the previous TCAM stage indicates the match.

8. The TCAM of claim 7, further comprising means for outputting results of the comparing to a subsequent TCAM stage.

9. The TCAM of claim 7, in which the cell is a static random access memory means.

10. The TCAM of claim 6, in which each TCAM stage includes at least the pull-up means, the pull-down means, a search means, a mask memory means, the match line bar, a match output means, and a key memory means.

11. A ternary content addressable memory (TCAM), comprising:

a pull-up transistor stack configured to receive a first match line output from a previous TCAM stage at a current TCAM stage, the pull-up transistor stack setting a match line bar at the current TCAM stage to a high value when the first match line output indicates a match; and a pull-down transistor configured to receive the first match line output at the current TCAM stage, the pull-down transistor setting the match line bar at the current TCAM stage to a low value when the first match line output indicates a mismatch.

12. The TCAM of claim 11, further comprising:

a key cell configured to compare a search value to data of the key cell when the first match line output indicates the match; and a mask cell configured to compare a search bar value to data of the mask cell when the first match line output indicates the match.

13. The TCAM of claim 12, further comprising a second match line output configured to output results of the comparing of the current TCAM stage to a subsequent TCAM stage.

14. The TCAM of claim 12, in which the key cell and the mask cell are static random access memory (SRAM) cells.

15. The TCAM of claim 11, in which each TCAM stage includes at least the pull-up transistor stack, the pull-down transistor, a search line, a mask cell, the match line bar, a second match line output, and a key cell.

* * * * *